United States Patent
En et al.

(10) Patent No.: US 6,933,579 B1
(45) Date of Patent: Aug. 23, 2005

(54) SEMICONDUCTOR SOLID PHASE EPITAXY DAMAGE CONTROL METHOD AND INTEGRATED CIRCUIT PRODUCED THEREBY

(75) Inventors: William George En, Milpitas, CA (US); Witold P. Maszara, Morgan Hill, CA (US); Mario M. Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 62 days.

(21) Appl. No.: 10/728,001

(22) Filed: Dec. 3, 2003

(51) Int. Cl.$^7$ ...................... H01L 29/78; H01L 21/336
(52) U.S. Cl. ...................................... 257/408; 438/300
(58) Field of Search ............................... 257/288, 327, 257/344, 346, 368, 382, 384, 401, 408; 438/197, 438/293, 299, 300–303, 305–306

(56) References Cited

U.S. PATENT DOCUMENTS

| | | | |
|---|---|---|---|
| 4,584,026 A | | 4/1986 | Wu et al. |
| 4,659,392 A | | 4/1987 | Vasudev |
| 5,336,903 A | * | 8/1994 | Ozturk et al. ................. 257/19 |
| 5,998,271 A | | 12/1999 | Schwalke |
| 6,174,791 B1 | | 1/2001 | Lin et al. |
| 6,187,655 B1 | | 2/2001 | Wang et al. |
| 2004/0245581 A1 | * | 12/2004 | Tsuchiaki ................... 257/382 |

* cited by examiner

Primary Examiner—Evan Pert
(74) Attorney, Agent, or Firm—Mikio Ishimaru

(57) ABSTRACT

A method of forming an integrated circuit with a semiconductor substrate is provided. A gate dielectric is formed on the semiconductor substrate, and a gate is formed on the gate dielectric. A raised source/drain layer is formed on the semiconductor substrate adjacent the gate and the gate dielectric. An amorphized shallow source/drain extension implanted region is formed in the raised source/drain layer and the semiconductor substrate therebeneath. The amorphized region is then recrystallized to form a shallow source/drain extension having residual recrystallization damage elevated into the raised source/drain layer.

20 Claims, 4 Drawing Sheets

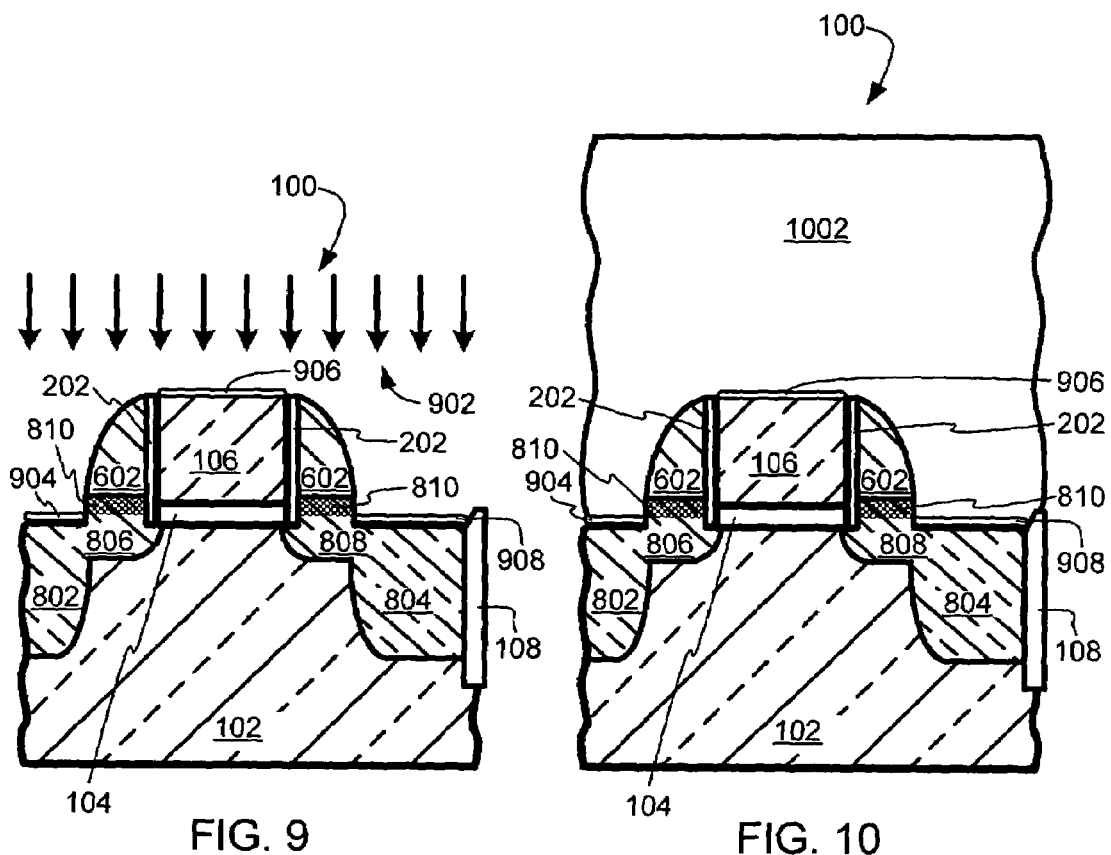
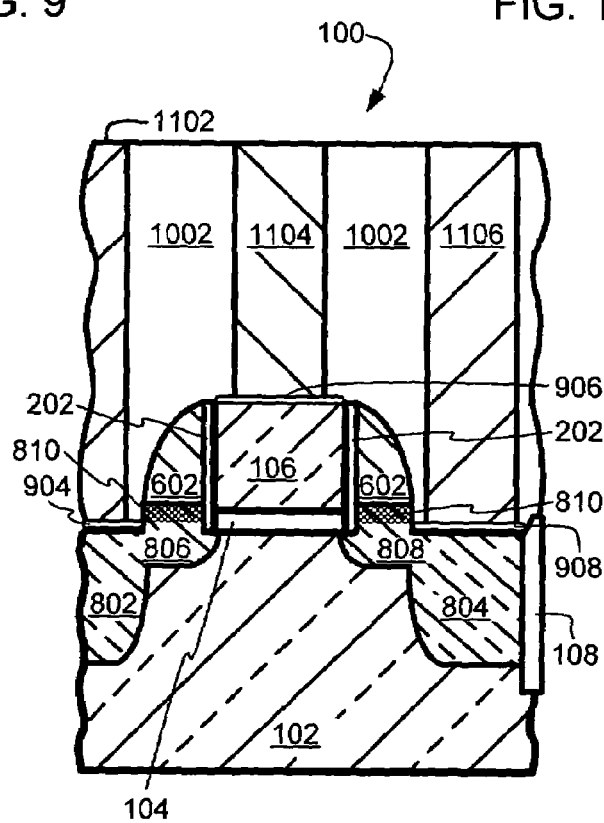

SEMICONDUCTOR SOLID PHASE EPITAXY DAMAGE CONTROL METHOD AND INTEGRATED CIRCUIT PRODUCED THEREBY

BACKGROUND

1. Technical Field

The present invention relates generally to semiconductor technology, and more specifically to solid phase epitaxy damage control in semiconductor devices.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. These lightly doped regions of the silicon substrate are referred to as "shallow source/drain junctions", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain ("S/D") junctions, which are called "deep S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one S/D contact through one S/D junction through the channel to the other S/D junction and to the other S/D contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow S/D regions by ion implantation of boron or phosphorus impurity atoms into the surface of the silicon substrate. The ion implantation is followed by a high-temperature anneal above 700° C. to activate the implanted impurity atoms to form the shallow S/D junctions.

A silicon nitride layer is deposited and etched to form sidewall spacers around the side surfaces of the gate oxides and polysilicon gates. The sidewall spacers, the gate oxides, and the polysilicon gates are used as masks for the conventional S/D regions by ion implantation of boron or phosphorus impurity atoms into the surface of the silicon substrate into and through the shallow S/D junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the S/D junctions and to the polysilicon gates. The contact openings are then filled with a conductive metal and interconnected by formation of conductive wires in other interlayer dielectric ("ILD") layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by first applying a thin layer of the cobalt or titanium on the silicon substrate above the S/D junctions and the polysilicon gates. The semiconductor wafer is subjected to one or more annealing steps at temperatures above 800° C., and this causes the cobalt or titanium to selectively react with the silicon and the polysilicon to form the metal silicide. The process is generally referred to as "siliciding". Since the shallow trench oxide and the sidewall spacers will not react to form a silicide, the silicides are aligned over the S/D junctions and the polysilicon gates so the process is also referred to as "self-aligned siliciding", or "saliciding".

As the dimensions of polysilicon gates continue to shrink, the so-called "narrow line" effect becomes a major concern in producing high quality, self-aligned silicide layers. The narrow line effect refers to problems due to the reduction in gate dimensions. With small gate dimensions, too much stress may accumulate at the interface between the polysilicon gate and the metal silicide layer. In addition, there may be too few nucleation sites on the original gate surface for forming a high quality metal silicide layer. This leads to an increase in sheet resistance that may adversely affect the operation of the transistor gate.

Therefore, in the fabrication of semiconductor devices having a line width smaller than, for example, 0.25 μm, a pre-amorphization implant ("PAI") is frequently carried out first. The PAI is an implant that creates a layer of amorphous silicon at the top of the polysilicon gate and the S/D regions of the transistor, so that a subsequent self-aligned silicide process can produce a metal silicide layer having a lower sheet resistance.

PAI is also valuable for other purposes. For example, ion implantation of energetic impurity atoms into a silicon substrate to change its electronic properties is common in the electronics industry. For an ion-implanted impurity to be electrically active, it must be located in substitutional sites in the crystal lattice of the surface layer of the substrate. To cause the implant to become substitutional and electrically active, an annealing process is performed.

The ion implantation of the impurity atoms occurs prior to the annealing process. If the ion implantation energy of the impurity atoms is sufficient, it can damage the silicon substrate enough to amorphize the surface of the silicon substrate. If the damage is sufficient, lower annealing temperatures (e.g., 900° C. or less) may be adequate to produce sufficient regrowth of the amorphized silicon by solid-phase epitaxy ("SPE") to restore the surface of the silicon substrate with minimal crystal defects. It may also be sufficient to locate the implanted ions properly in substitutional sites.

Such lower annealing temperatures are desirable to limit implant migration and to preserve implantation profiles. However, a low-dose impurity ion implant, e.g. below about $10^{15}$ ions/cm$^2$ of phosphorus, arsenic, or boron, will not typically produce the desired degree of damage in the silicon substrate to warrant the use of lower annealing temperatures.

To compensate, a PAI can be used to amorphize the surface of the silicon and create the additional damage necessary for an impurity ion implant to become substitutional at lower annealing temperatures. Such a PAI is generally carried out with inert ions such as silicon, neon, or argon, although it is known that any atom can be used to amorphize silicon.

During the subsequent annealing process, the healing of such ion implant-induced damage is the result of epitaxial growth through SPE, during which the amorphous silicon is recrystallized into the form of monocrystalline silicon.

SPE has also been used to form abrupt and shallow S/D extensions. PAI can be performed prior to the SPE formation of such extensions to achieve better activation during recrystallization of the SPE. However, the SPE process can leave residual damage along the path of the electrical current in the transistor. For example, such defects can leave amorphous layers between the silicon oxide and the silicon. The residual damage will then degrade the performance of the transistor device.

A long felt need therefore remains for improvements to such SPE processes that will remove such defects without necessitating the use of higher annealing temperatures.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. A raised source/drain layer is formed on the semiconductor substrate adjacent the gate and the gate dielectric. An amorphized shallow source/drain extension implanted region is formed in the raised source/drain layer and the semiconductor substrate therebeneath. The amorphized region is then recrystallized to form a shallow source/drain extension having residual recrystallization damage elevated into the raised source/drain layer. The elevated source/drain layer thus affords a better recrystallization and locates the residual recrystallization damage above and away from the transistor channel, and out of the current flow path therein.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 9 is the structure of FIG. 8 during the formation of silicide;

FIG. 10 is the structure of FIG. 9 after deposition of a dielectric layer over the silicide, the sidewall spacer, and the shallow trench isolation;

FIG. 11 is the structure of FIG. 10 after formation of metal contacts; and

BEST MODE FOR CARRYING OUT THE INVENTION

Figure 1:
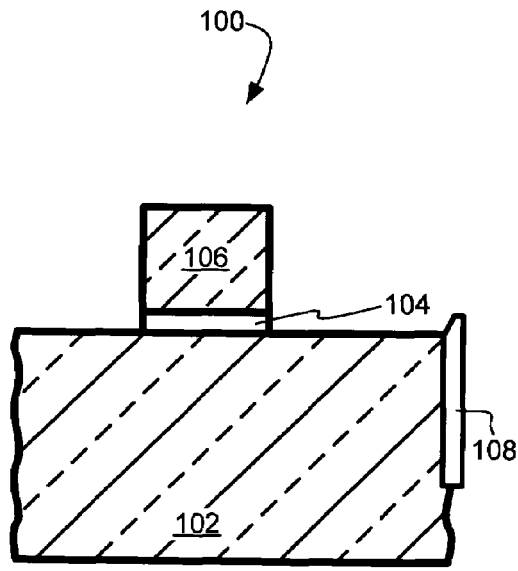
FIG. 1 is a view of a semiconductor integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

In the formation of the present integrated circuits, solid phase epitaxy ("SPE") is used to form abrupt and shallow source/drain ("S/D") extensions. To achieve better activation during recrystallization of the SPE, pre-amorphization implantation ("PAI") is performed prior to the SPE formation of such extensions. To avoid leaving residual SPE process damage along the path of the electrical current in the transistor, solid epitaxy growth ("SEG") is used to raise or elevate the S/Ds before the PAI and the S/D dopant implant. Following the PAI and the S/D dopant implant, the semiconductor surface is then amorphized and recrystallized to activate the dopants. During the SPE recrystallization of the deposited SEG, the silicon crystallization grows at least all the way to the original silicon surface. This causes the SPE to leave the residual damage layer behind at the elevated surface level, above and away from the transistor channel, and thus above and out of the way of the path of the electrical current in the transistor.

In greater detail, and referring now to FIG. 1, therein is shown a semiconductor integrated circuit, and in particular a transistor 100, in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation ("STI") 108.

Figure 2:
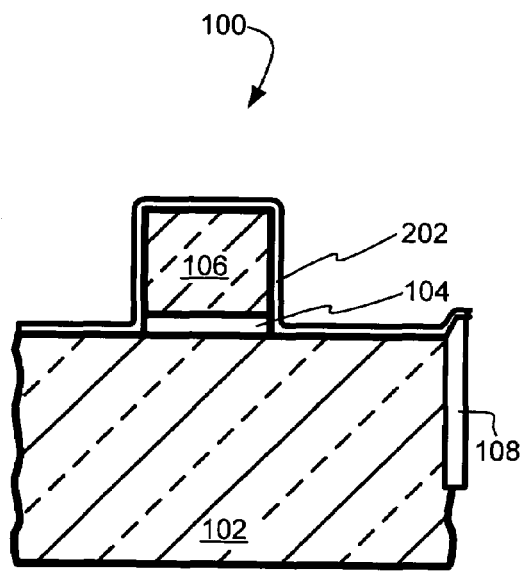
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
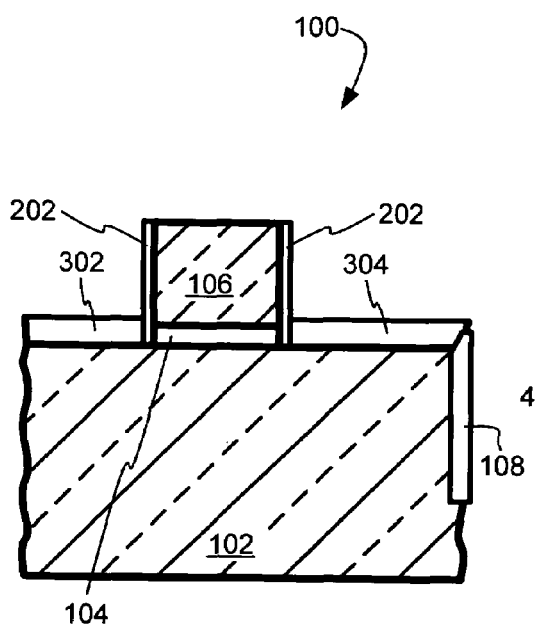
FIG. 3 is the structure of FIG. 2 following an isotropic etch of the liner layer and formation of raised source/drain layers.

Referring now to FIG. 3, therein is shown the structure of FIG. 2 following an isotropic etch of the liner layer 202 to remove the horizontal extents thereof. Raised S/D layers 302 and 304 have then been formed by SEG on the surface of the semiconductor substrate 102 adjacent the gate dielectric 104 and the gate 106.

Figure 4:
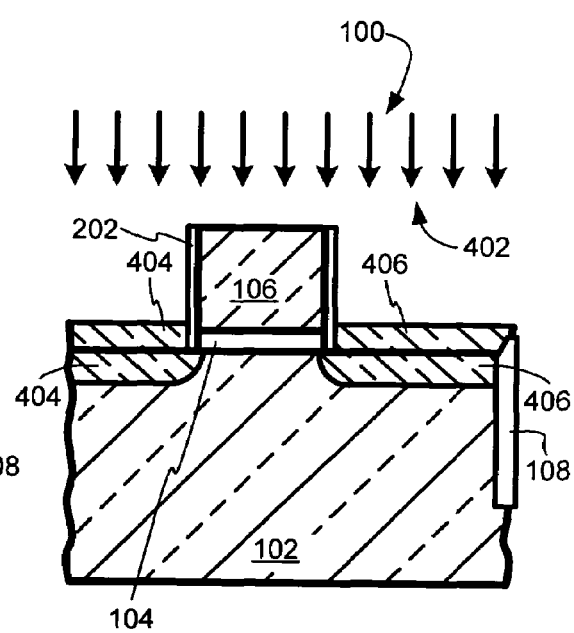
FIG. 4 is the structure of FIG. 3 during an ion implantation to form shallow source/drain extension implanted regions.

Referring now to FIG. 4, therein is shown the structure of FIG. 3 during an ion implantation 402 to form shallow source/drain ("S/D") extension implanted regions 404 and 406 in the raised S/D layers 302 and 304 (FIG. 3) and in the top of the semiconductor substrate 102. The gate 106 and the gate dielectric 104 act as masks for the formation of the shallow S/D extension implanted regions 404 and 406 by the ion implantation 402 of, for example, boron (B) or phosphorus (P) impurity atoms.

Figure 5:
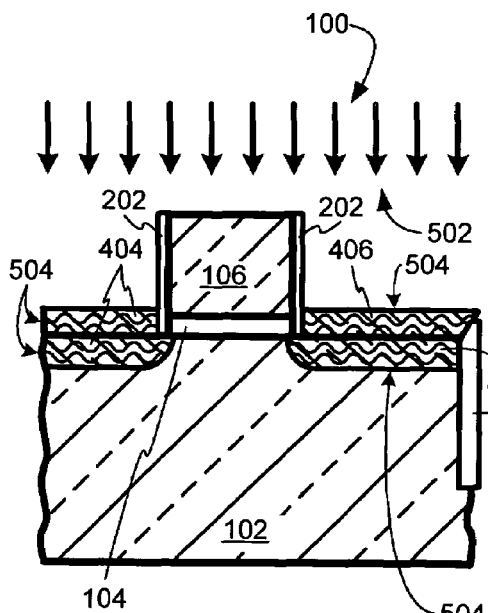
FIG. 5 is the structure of FIG. 4 during an ion implantation to form amorphized regions in the shallow source/drain extension implanted regions.

Referring now to FIG. 5, therein is shown the structure of FIG. 4 during a PAI implantation 502 to form amorphized regions 504 in the shallow S/D extension implanted regions 404 and 406 on each side of and adjacent the gate 106 and the gate dielectric 104. The amorphized regions 504 may be formed, for example, by a damaging ion implantation of an inert species such as germanium (Ge), silicon (Si), or Argon (A). The implantation damage from the PAI creates a disordered (amorphous) layer that upon subsequent annealing causes the ion implantation 402 (FIG. 4) to become substitutional at lower annealing temperatures and produces better activation during the recrystallization of the SPE.

Figure 6:
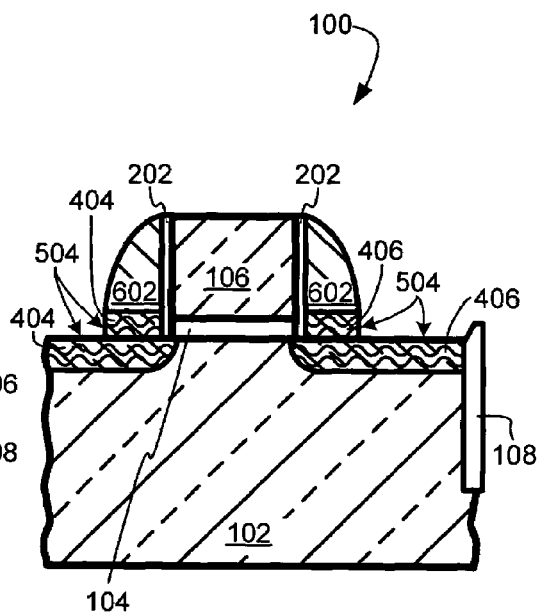
FIG. 6 is the structure of FIG. 5 after formation of a curved sidewall spacer.

Referring now to FIG. 6, therein is shown the structure of FIG. 5 after formation of a curved sidewall spacer 602 and patterning and etching of portions of the shallow S/D extension implanted regions 404 and 406 formed from the raised S/D layers 302 and 304 (FIG. 3). A sidewall spacer layer, generally of silicon nitride, was deposited over the raised S/D layers 302 and 304 and etched to form the curved shape of the sidewall spacer 602 adjacent the gate dielectric 104 and the gate 106. The shallow S/D extension implanted regions 404 and 406 that were formed from the raised S/D layers 302 and 304, having a lateral extent greater than that of the sidewall spacer 602, were then patterned and etched to remove the portions thereof extending laterally beyond the sidewall spacer 602.

Figure 7:
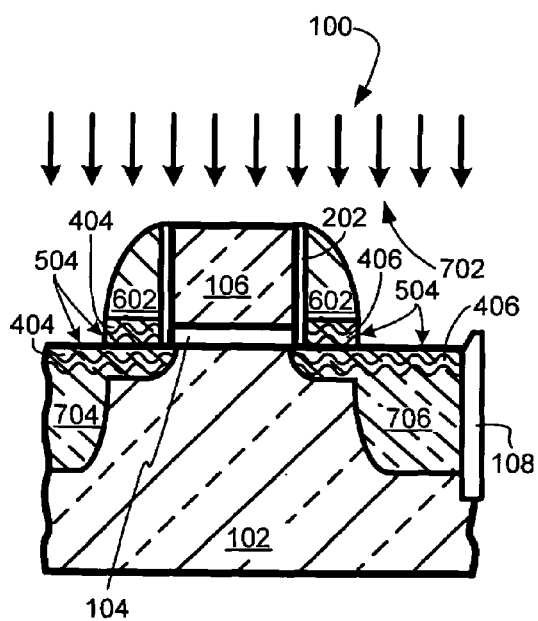
FIG. 7 is the structure of FIG. 6 during ion implantation to form deep source/drain junction implanted regions.

Referring now to FIG. 7, therein is shown the structure of FIG. 6 during an ion implantation 702 to form deep S/D junction implanted regions 704 and 706 augmenting the shallow S/D extension implanted regions 404 and 406, respectively. The sidewall spacer 602, the gate 106, and the STI 108 act as masks for the formation of the deep S/D junction implanted regions 704 and 706. These implanted regions are formed by the ion implantation 702 of boron or phosphorus impurity atoms into the surface of the semiconductor substrate 102 and into and through the shallow S/D extension implanted regions 404 and 406, respectively.

Figure 8:
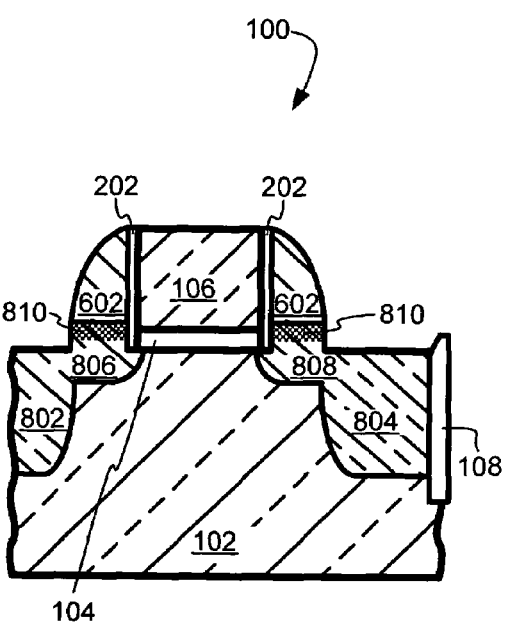
FIG. 8 is the structure of FIG. 7 following a high temperature solid phase epitaxy anneal.

Referring now to FIG. 8, therein is shown the structure of FIG. 7 following a high-temperature SPE anneal above 700° C. that regrows and recrystalizes the amorphized silicon in the amorphized regions 504 and activates the ion implantation 402 (FIG. 4) and the ion implantation 702 (FIG. 7). During the annealing process, the SPE epitaxial growth heals the ion implantation-induced damage from the ion implantation 402, the PAI implantation 502 (FIG. 5), and the ion implantation 702. The annealing causes the amorphous silicon to recrystalize into the form of monocrystalline silicon, and locates the implanted impurity dopant ions properly in the desired substitutional sites to activate the ions. The activation of the ions completes the formation of deep S/D junctions 802 and 804 and shallow S/D extensions 806 and 808 from the deep S/D junction implanted regions 704 and 706 and the shallow S/D extension implanted regions 404 and 406, respectively.

A concomitant effect of the SPE annealing process is the residual damage 810 (FIG. 8) that the SPE annealing process leaves along the surface of the recrystallized monocrystalline silicon. To avoid leaving the residual recrystallization damage along the path of the electrical current in the transistor (i.e., right under the gate dielectric 104), the present invention uses the raised S/D layers 302 and 304 (FIG. 3) to raise or elevate the recrystallization surface of the S/Ds above the surface of the semiconductor substrate 102, and thus above and out of the transistor current path. During the SPE recrystallization, the silicon crystallization grows up to the elevated silicon surface of the raised S/D layers 302 and 304. This causes the SPE to elevate or raise the residual damage 810 and leave it at this elevated surface level in the raised S/D layers 302 and 304, above and away from the transistor channel and above and out of the path of the electrical current in the transistor. The electrical current path is then free of the residual SPE damage.

Referring now to FIG. 9, therein is shown a deposition process 902 used in the formation of silicide layers 904, 906, and 908 in accordance with the present invention. The silicide layers 904 and 908 are formed with the surface of the semiconductor substrate 102 over the deep S/D junctions 802 and 804, respectively, and the silicide layer 906 is formed on the gate 106.

Referring now to FIG. 10, therein is shown the structure of FIG. 9 after deposition of a dielectric layer 1002 over the silicide layers 904, 906, and 908, the sidewall spacer 602, and the STI 108.

In various embodiments, the dielectric layer 1002 is of dielectric materials such as silicon oxide ("$SiO_x$"), tetraethylorthosilicate ("TEOS"), borophosphosilicate ("BPSG") glass, etc., with dielectric constants from 4.2 to 3.9, or low dielectric constant dielectric materials such as fluorinated tetraethylorthosilicate ("FTEOS"), hydrogen silsesquioxane ("HSQ"), bis-benzocyclobutene ("BCB"), tetramethylorthosilicate ("TMOS"), octamethyleyclotetrasiloxane ("OMCTS"), hexamethyldisiloxane ("HMDS"), trimethylsilil borxle ("SOB"), diaceloxyditerliarybutosiloxane ("DADBS"), trimethylsilil phosphate ("SOP"), etc., with dielectric constants below 3.9 to 2.5. Available ultra-low dielectric constant dielectric materials, having dielectric constants below 2.5, include commercially available Teflon-AF, Teflon microemulsion, polimide nanofoams, silica aerogels, silica xerogels, and mesoporous silica. Stop layers and capping layers ("where used") are of materials such as silicon nitride ("$Si_xN_x$") or silicon oxynitride ("SiON").

Referring now to FIG. 11, therein is shown the structure of FIG. 10 after formation of metal contacts 1102, 1104, and 1106. The metal contacts 1102, 1104, and 1106 are respectively electrically connected to the silicide layers 904, 906, and 908, and respectively to the deep S/D junction 802, the gate 106, and the deep S/D junction 804.

In various embodiments, the metal contacts 1102, 1104, and 1106 are of metals such as tantalum ("Ta"), titanium ("Ti"), tungsten ("W"), alloys thereof, and compounds thereof. In other embodiments, the metal contacts 1102, 1104, and 1106 are of metals such as copper ("Cu"), gold ("Au"), silver ("Ag"), alloys thereof, and compounds thereof with one or more of the above elements with diffusion barriers around them.

Figure 12:
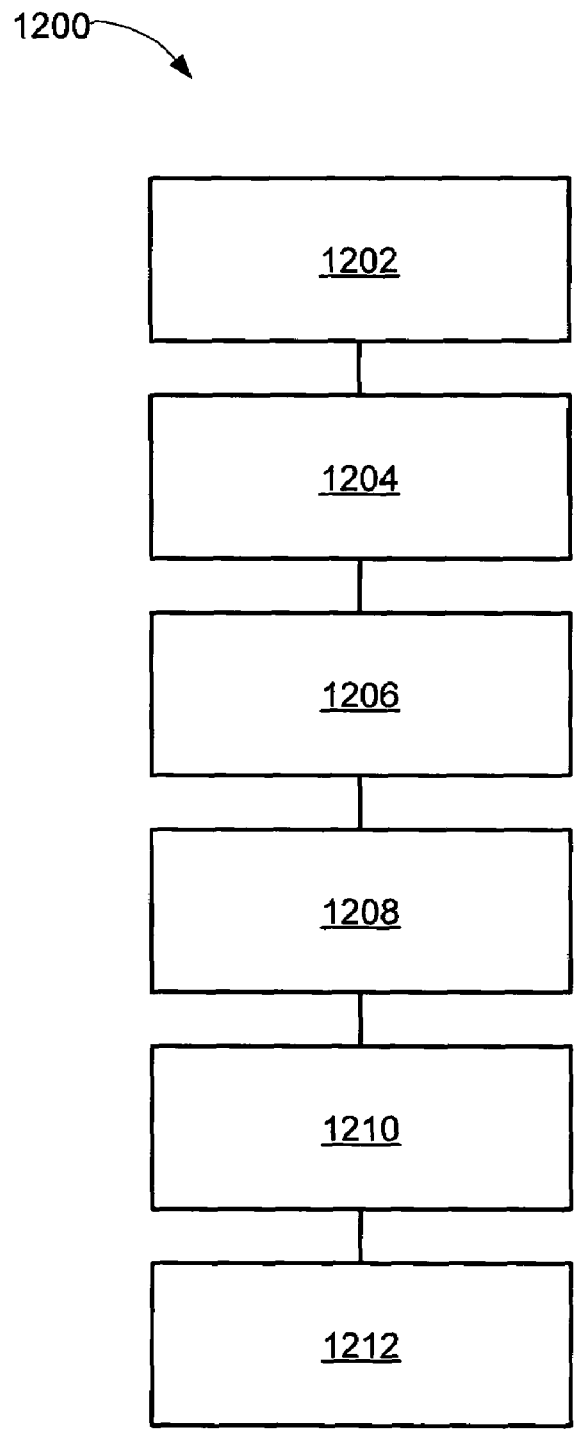
FIG. 12 is a simplified flow chart of the method of manufacturing the semiconductor integrated circuit in accordance with the present invention.

Referring now to FIG. 12, therein is shown a simplified flow chart of a method 1200 in accordance with the present invention. The method 1200 includes: providing a semiconductor substrate in a step 1202; forming a gate dielectric on the semiconductor substrate in a step 1204; forming a gate on the gate dielectric in a step 1206; forming at least one raised source/drain layer on the semiconductor substrate adjacent the gate and the gate dielectric in a step 1208; forming at least one amorphized shallow source/drain extension implanted region in the raised source/drain layer and the semiconductor substrate therebeneath in a step 1210; and recrystalizing the amorphized region to form at least one shallow source/drain extension having residual recrystallization damage elevated into the raised source/drain layer in a step 1212.

Thus, as taught herein, the residual damage from the PAI and the dopant implantation are not situated right next to the transistor channel. Instead, the present invention uses SEG to elevate the S/Ds before the PAI and the dopant implantation. The surface is then recrystallized using SPE to restore the silicon crystalline structure and to activate the dopants. During the SPE recrystallization annealing process, the silicon crystallization grows beyond and above the original silicon surface to the higher surface of the deposited SEG. This causes the SPE to leave the residual damage layer behind at the elevated SEG surface. The elevated S/Ds thus afford a better recrystallization and locate the residual SPE damage above and away from the transistor channel, and out of the current flow path therein.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of forming an integrated circuit comprising:
   providing a semiconductor substrate;
   forming a gate dielectric on the semiconductor substrate;
   forming a gate on the gate dielectric;
   forming at least one raised source/drain layer on the semiconductor substrate adjacent the gate and the gate dielectric;
   forming at least one amorphized shallow source/drain extension implanted region in the raised source/drain layer and the semiconductor substrate therebeneath; and
   recrystalizing the amorphized region to form at least one shallow source/drain extension having residual recrystallization damage elevated into the raised source/drain layer.

2. The method as claimed in claim 1 wherein the raised source/drain layer is formed by solid epitaxy growth.

3. The method as claimed in claim 1 wherein forming at least one amorphized shallow source/drain extension implanted region further comprises amorphizing the region by a damaging ion implantation of an inert species.

4. The method as claimed in claim 1 further comprising:
   forming a curved sidewall spacer adjacent the gate dielectric and the gate, with portions of the raised source/drain layer having a lateral extent greater than that of the curved sidewall spacer; and
   removing portions of the raised source/drain layer extending laterally beyond the curved sidewall spacer.

5. The method as claimed in claim 1 further comprising:
   forming a deep source/drain junction augmenting the shallow source/drain extension;
   forming a silicide on the deep source/drain junction and on the gate;
   depositing an interlayer dielectric above the semiconductor substrate; and
   forming contacts in the interlayer dielectric to the silicide.

6. A method of forming an integrated circuit comprising:
   providing a semiconductor substrate;
   forming a gate dielectric on the semiconductor substrate;
   forming a gate on the gate dielectric;
   forming raised source/drain layers on the surface of the semiconductor substrate on each side of and adjacent the gate and the gate dielectric;
   implanting the raised source/drain layers and the semiconductor substrate therebeneath;
   amorphizing the implanted raised source/drain layers and the implanted semiconductor substrate therebeneath to form amorphized shallow source/drain extension implanted regions; and
   recrystalizing the amorphized shallow source/drain extension implanted regions with solid phase epitaxy to form shallow source/drain extensions having residual recrystallization damage from the solid phase epitaxy elevated into the raised source/drain layers above the surface of the semiconductor substrate.

7. The method as claimed in claim 6 wherein the raised source/drain layers are formed by solid epitaxy growth.

8. The method as claimed in claim 6 wherein amorphizing the implanted raised source/drain layers and the implanted semiconductor substrate therebeneath further comprises amorphizing by a damaging ion implantation of an inert species.

9. The method as claimed in claim 6 further comprising:
   forming a curved sidewall spacer adjacent the gate dielectric and the gate, with portions of the raised source/drain layers having a lateral extent greater than that of the curved sidewall spacer; and
   removing portions of the raised source/drain layers extending laterally beyond the curved sidewall spacer.

10. The method as claimed in claim 6 further comprising:
    forming deep source/drain junctions augmenting the shallow source/drain extensions;
    forming a silicide on the deep source/drain junctions and on the gate;

depositing an interlayer dielectric above the semiconductor substrate; and forming contacts in the interlayer dielectric to the silicide.

11. An integrated circuit comprising:
a semiconductor substrate;
a gate dielectric on the semiconductor substrate;
a gate on the gate dielectric;
at least one raised source/drain layer on the semiconductor substrate adjacent the gate and the gate dielectric; and
at least one shallow source/drain extension having residual recrystallization damage elevated into the raised source/drain layer.

12. The integrated circuit as claimed in claim 11 wherein the raised source/drain layer is a solid epitaxy growth layer.

13. The integrated circuit as claimed in claim 11 wherein the shallow source/drain extension is formed in a shallow source/drain extension implanted region amorphized by an inert species damaging ion implantation.

14. The integrated circuit as claimed in claim 11 further comprising a curved sidewall spacer over the raised source/drain layer adjacent the gate dielectric and the gate.

15. The integrated circuit as claimed in claim 11 further comprising:
a deep source/drain junction augmenting the shallow source/drain extension;
a silicide on the deep source/drain junction and on the gate;
an interlayer dielectric above the semiconductor substrate; and
contacts in the interlayer dielectric to the silicide.

16. An integrated circuit comprising:
a semiconductor substrate;
a gate dielectric on the semiconductor substrate;
a gate on the gate dielectric;
raised source/drain layers on the surface of the semiconductor substrate on each side of and adjacent the gate and the gate dielectric; and
implanted recrystallized shallow source/drain extensions having residual recrystallization damage elevated into the raised source/drain layers above the surface of the semiconductor substrate.

17. The integrated circuit as claimed in claim 16 wherein the raised source/drain layers are solid epitaxy growth layers.

18. The integrated circuit as claimed in claim 16 wherein the shallow source/drain extensions are formed in shallow source/drain extension implanted regions amorphized by an inert species damaging ion implantation.

19. The integrated circuit as claimed in claim 16 further comprising a curved sidewall spacer over the raised source/drain layers adjacent the gate dielectric and the gate.

20. The integrated circuit as claimed in claim 16 further comprising:
deep source/drain junctions augmenting the shallow source/drain extensions;
a silicide on the deep source/drain junctions and on the gate;
an interlayer dielectric above the semiconductor substrate; and
contacts in the interlayer dielectric to the silicide.

* * * * *